United States Patent [19]

Fukuda

[11] Patent Number: 5,048,066
[45] Date of Patent: Sep. 10, 1991

[54] X-RAY EXPOSURE PROCESS FOR PREVENTING ELECTROSTATIC ATTRACTION OR CONTACT OF X-RAY MASKS

[75] Inventor: Yasuaki Fukuda, Hadano, Japan
[73] Assignee: Canon Kabushiki Kaisha, Tokyo, Japan
[21] Appl. No.: 624,521
[22] Filed: Dec. 10, 1990

Related U.S. Application Data

[63] Continuation of Ser. No. 290,641, Dec. 27, 1989, abandoned.

[30] Foreign Application Priority Data

Dec. 29, 1987 [JP] Japan ................................. 62-335225

[51] Int. Cl.$^5$ ............................................... G21K 5/00
[52] U.S. Cl. ...................................... 378/34; 378/210
[58] Field of Search ................................... 378/34, 35

[56] References Cited

U.S. PATENT DOCUMENTS 3,974,382  8/1976  Bernacki .............................. 378/34
4,852,133  7/1989  Ikeda et al. .......................... 378/34

Primary Examiner—Craig E. Church
Attorney, Agent, or Firm—Fitzpatrick, Cella, Harper & Scinto

[57] ABSTRACT

Provided are an X-ray mask support member, an X-ray mask, and an X-ray exposure process using the X-ray mask, that can effectively prevent the phenomenon of electrostatic attraction or contact of X-ray masks by appropriately disposing an X-ray mask support membrane in an exposure apparatus that employs soft X-rays. A high precision alignment can be performed.

23 Claims, 2 Drawing Sheets

X-RAY EXPOSURE PROCESS FOR PREVENTING ELECTROSTATIC ATTRACTION OR CONTACT OF X-RAY MASKS

This application is a continuation of application Ser. No. 290,641 filed Dec. 27, 1988, now abandoned.

BACKGROUND OF THE INVENTION

1. Field of the Invention

The present invention relates to an X-ray mask for manufacturing semiconductor devices such as IC and ULSI. More particularly it is concerned with an X-ray mask suited to an exposure apparatus for manufacturing semiconductor devices, that uses a soft X-ray having wavelengths of about 2 Å to about 150 Å.

2. Related Background Art

In recent years, in exposure apparatus for manufacturing semiconductor devices such as IC and LSI, many kinds of exposure apparatus utilizing soft X-rays and capable of obtaining prints with a higher resolution have been proposed as the semiconductor devices have become more highly integrated.

In general, the X-ray mask used in this soft-X-ray apparatus includes a support frame of ring shape, and a membraneous member stretchingly covering the support frame opening and having X-ray transmitting portions and X-ray non-transmitting portions.

The non-transmitting portions are formed of an X-ray opaque material (including an absorber) having a geometrical pattern and are provided on a support membrane (a mask membrane) that constitute a substrate in the membraneous member. The X-ray opaque material is so arranged that patterns are accurately transferred onto a wafer surface in the size on the order of submicrons. On the other hand, the transmitting portions are made of the mask support membrane itself corresponding to the part on which the light-shielding material is not provided.

In the exposure apparatus using soft X-rays, both the space in which the X-ray mask is disposed and the upper space of a wafer on the side on which a resist is coated are, in many instances, put under a reduced pressure atmosphere or a low-pressure helium atmosphere in order to prevent absorption loss of energy of the light irradiated from a soft X-ray source for exposure.

If exposure is carried out using soft X-rays having wavelengths, for example, of approximately from 2 to 150 Å under such conditions, the X-ray mask support membrane, a mask absorber and atmospheric gas atoms absorb the soft X-ray and emit photoelectrons by virtue of a photoelectric effect. In particular, when the support membrane includes an insulator thin membrane, such exposure causes not only: electrostatic charging due to the emission of photoelectrons from the constituent atoms of the support membrane, but also electrostatic charging due to the emission of photoelectrons from the absorber having a large number of electrons, resulting in a support membrane having a high positive potential.

In general, the distance between the support membrane and the resist surface on the wafer is so small that run-out error caused by divergent light from the source can be reduced to a minium, and is set, for example, in the range of from 10 μm to 100 μm. For this reason, the electrically charged support membrane and wafer may electrostatically attract each other resulting in deformation of the support membrane. Thus, precision of the exposed pattern is sometimes lowered, because of flexure of the support membrane or because the support membrane contacts the wafer when the attraction force is strong.

In an exposure apparatus attempting to obtain a high resolution such that the size of a pattern to be transferred is 0.5 μm or less, the support membrane is commonly so constituted that it may have a thickness of about 2 μm, using an inorganic material (ceramics in particular) having a small thermal expansion coefficient and large Young's modulus so that misregistration due to its thermal expansion or the distortion of absorbers due to residual stress can be suppressed.

In general, many of the materials for this purpose are brittle and hard. Hence, it has sometimes occurred that the support membrane was easily broken by excessive deformation or application of nonuniform pressure.

In order to overcome this problem, there is, for example, a method in which a metal having reduced absorption to X-rays, as exemplified by aluminum, is deposited in a thickness on the order of hundreds of Å on the surface. This method can achieve a good electric conductance and good soft-X-ray transmittance, but has involved problems that the transmission of visible or infrared light in making alignment with the wafer is so extremely low that the precision of alignment may be extremely lowered.

SUMMARY OF THE INVENTION

An object of the present invention is to provide an X-ray mask support member, an X-ray mask, and an X-ray exposure process using the X-ray mask, that can effectively prevent the phenomenon of electrostatic attraction or contact of X-ray masks by appropriately disposing an X-ray mask support membrane in an exposure apparatus that employs soft X-rays, by which a high precision alignment can be performed.

The above object can be achieved by the invention described below.

The present invention provides an X-ray mask support member comprising an X-ray transmissive support membrane held on the support frame, wherein the support membrane has an electrical resistivity on the order of 10 Ω.cm or less.

The present invention also provides an X-ray mask comprising an X-ray transmissive support membrane held on the support frame and an X-ray absorber provided in a pattern form on the surface of the support membrane, wherein the support membrane has an electrical resistivity of 10 Ω.cm or less.

The present invention further provides an X-ray exposure process, comprising;

disposing an X-ray mask, adjacent to a wafer with an X-ray sensitive member thereon, comprising a support frame and a support membrane held thereon which is X-ray transmissive and has an electrical resistivity of 10 Ω.cm or less, and an X-ray absorber provided in a pattern form on the surface of the support membrane; and irradiating the wafer with the X-ray sensitive member thereon through the X-ray mask with X-rays.

In another embodiment of the process, the present invention also provides an X-ray exposure process comprising;

disposing an X-ray mask, adjacent to a wafer with an X-ray sensitive member thereon, comprising a support frame and a support membrane held thereon which is X-ray transmissive and has an electrical resistivity of 10

Ω.cm or less, and an X-ray absorber provided in a pattern form on the surface of the support membrane;

irradiating the wafer with the X-ray sensitive member thereon through the X-ray mask with X-rays; and eliminating static charges on said the X-ray mask.

DETAILED DESCRIPTION OF THE PREFERRED EMBODIMENTS

Figure 1:
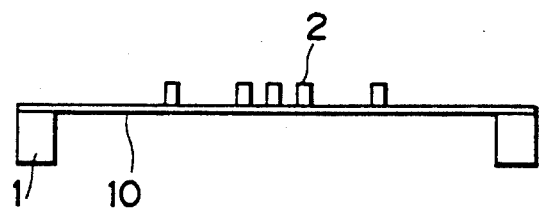
FIG. 1 is a schematic cross section of the X-ray mask of the present invention.

FIG. 1 is a schematic cross section of the X-ray mask of the present invention. In FIG. 1, reference numeral 10 denotes a support membrane, comprising a single transmissive layer having a given transmittance to soft X-rays. Reference numeral 1 denotes a support frame of ring shape, which stretchingly holds the support membrane 10. Reference numeral 2 denotes a non-transmissive layer comprising an absorber to the soft X-rays, which is geometrically drawn on the support membrane 10 to form a pattern.

In this embodiment, the support membrane 10 is constituted of a material having a small electrical resistivity of 10 Ω.cm or less.

Thus, the support membrane 10 is endowed with electrical conductance on its surface or the whole, and the support membrane 10 is connected to a ground to maintain the potential thereof to the ground potential so that no electric charges may be accumulated on the surface of the support membrane 10 by the irradiation of X-rays.

The higher the X-ray transmittance of the support membrane 10 is, the better. For this purpose, it may preferably be arranged as thinly as possible when the same kind of material is used, but is also required to ensure its mechanical strength to a certain degree, and it is necessary to have a given thickness.

Accordingly, in the present embodiment, the thickness of the support membrane 10 is set to be not less than 1 μm and not more than 15 μm in instances in which the support membrane 10 comprises an organic membrane, because of its reduced absorption to the soft X-rays per unit thickness, and is set to be not less than 0.5 μm and not more than 5 μm in instances in which it comprises an inorganic membrane mainly composed of light elements.

In the present embodiment, as materials to constitute the transmissive membrane 10 having an electrical resistivity of 10 Ω.cm or less, the membrane is constituted of one material selected from an elementary simple substance such as beryllium, boron, silicon and aluminum, conductive ceramics such as phosphorus-doped silicon carbide (SiC:P), and organic compounds such as poly(p-phenylene), polythiophene and polyaniline in which one material selected from the group consisting of arsenic pentafluoride, sulfuric acid anhydride and a halogen such as iodine has been added as a dopant provided that the dopant concentration is adjusted to such a level that may not hinder the object of the present invention.

On the X-ray mask support (or mask blank) described above in detail, an X-ray absorption pattern can be formed according to the following procedures, to prepare an X-ray mask.

Any X-ray absorbers having been used in conventional X-ray mask structures, such as thin films (having a thickness, for example, approximately of from 0.5 to 1 μm) of materials generally having a high density, as exemplified by gold, platinum, tungsten, tantalum, copper, nickel, and a material containing any of these, can be used in the present invention as the X-ray absorber formed on the above support membrane, without any particular limitations.

Such an X-ray absorber is formed as follows: providing a plating electrode layer on the above support membrane, patterning thereon a single-layer or multi-layer resist by electron-beam drawing, followed by electroplating, for example, of gold to form a gold pattern serving as the X-ray absorber. Alternatively, a film of W or Ta is formed on the support membrane and a single-layer or multi-layer resist is formed thereon by electron-beam drawing, followed by plasma etching of the W or Ta layer, and thus the X-ray absorber can be formed. Particularly when an inorganic membrane is formed on a silicon substrate, the X-ray absorber may be formed before the back etching of a silicon wafer.

Figure 4:
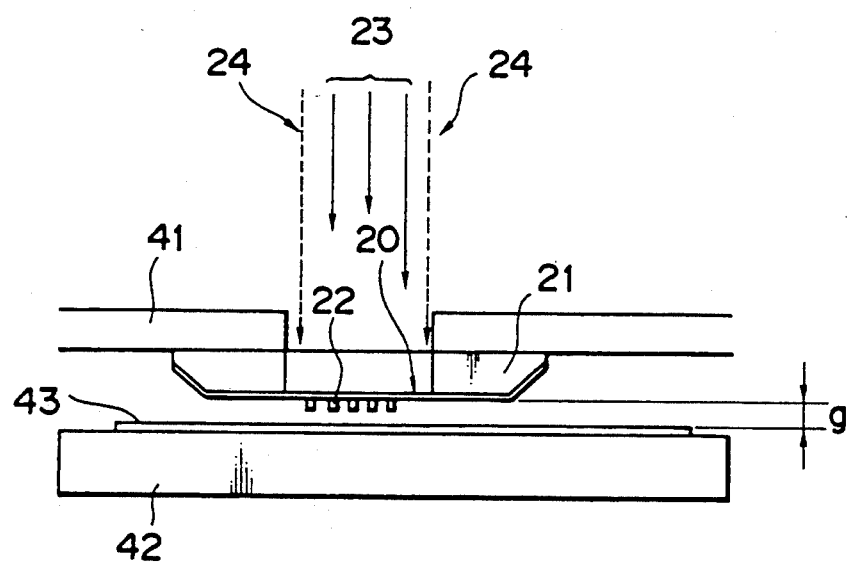
FIG. 4 is a schematic cross section to describe the X-ray exposure process of the present invention.

FIG. 4 schematically illustrates a method of carrying out X-ray proximity exposure by using a mask comprising a membrane 20 on which an absorber 22 has been formed.

The mask is fixed to a mask stage 41 through a frame 21 by chucking or like means. On the other hand, a silicon wafer 43 coated with an X-ray resist is fixed on a wafer chuck by vacuum attraction or like means. At this time, a gap g called a proximity gap is provided between the mask membrane and the surface of the wafer resist so that the mask can be prevented from contacting the wafer to prevent damage or breakage of the mask. The gap g is usually made in the range between 5 μm and 100 μm.

X-ray exposure is carried out using the exposure apparatus thus constituted. First, an alignment mark on the mask and an alignment mark on the wafer are registered with alignment light 24 of visible or infrared light to make alignment so that the relationship between the mask and wafer may be brought into a predetermined positional relationship. After the alignment has been completed, X-rays 23 for exposure are irradiated for a necessary period through a shutter, separately provided.

Usually, the exposure irradiation zone on the X-ray mask is smaller than on the wafer, and hence, it is common to continue to expose the whole wafer surface repeating the operation of alignment/X-ray irradiation/stage movement, sequentially.

Also, in order to prevent accumulating electrostatic charges on the support membrane 10 and on the surface of the wafer with X-ray sensitive member thereon 43, the following measures are taken for elimination of electric charge, such that;

(1) the support membrane 10 and wafer with X-ray sensitive member thereon 43 are both grounded;

(2) the support membrane 10 is electrically connected to the wafer with X-ray sensitive member thereon 43; or (3) a voltage is applied to each of the support membrane 10 and wafer with X-ray sensitive member thereon 43 so as to cancel the potential difference between the support membrane 10 and wafer with X-ray sensitive member thereon 43.

As in the above, the support membrane can be effectively protected from being electrostatically charged by the X-ray exposure, by using in the X-ray mask support membrane the material having a given electrical resistivity and also by carrying out a suitable treatment for elimination of electric charges at least at the time of the X-ray exposure, so that deformation of the support membrane or the like can be prevented. This deformation may be caused by the electrostatic attraction accompanying electrostatic charging and it is possible to transfer a pattern with a high precision.

The present invention will be described below in greater detail by giving Examples.

EXAMPLE 1

As a first example, first a support membrane comprising silicon carbide (SiC) having a carbon content higher than the stoichiometric composition (silicon:carbon = 1:1) was prepared according to a method of firing an organic silicon compound, polysilastyrene.

First, polysilastyrene (trade name: S-400; a product of Nippon Soda Co., Ltd.) was dissolved in toluene to prepare a 10 wt/V solution. This solution was coated using a spinner on a carbon substrate whose surface has been mirror-polished, to form a polysilastyrene film with a thickness of 30 $\mu$m. Next, this was put in a firing furnace together with the substrate to carry out firing in a dry nitrogen atmosphere at 200° C for 1 hour, and the temperature was raised up to 1,250° C. at a rate of 100° C./min and maintained at that temperature for 25 hours. Thereafter, the heating of the furnace was stopped to effect natural cooling to obtain a support membrane with a thickness of 2.8 $\mu$m, comprising silicon carbide. Electrical resistivity of the support membrane at this time was measured and found to be 0.1 $\Omega$.cm.

The resulting support membrane was stretchingly held on a circular support frame, and a gold pattern was further formed on the support membrane, thus preparing an X-ray mask. To effect elimination of electric charges, the support membrane was electrically connected to a wafer with an X-ray sensitive member thereon by a conductor wire. Upon exposure of this X-ray mask, no deformation was observed at all in the support membrane notwithstanding the irradiation of X-rays, and a high precision transfer of the pattern was performed.

EXAMPLE 2

As a second example, an SiC thin membrane was formed using a CVD (chemical vapor deposition) apparatus, on a silicon (Si) substrate of 2 mm in thickness, whose surface has been polished to 0.01 $\mu$m in root mean square roughness.

First, using silane gas (SiH$_4$) and methane gas (CH$_4$) as starting material gases, an SiC layer was formed under the conditions of a flow rate ratio of SiH$_4$/CH$_4$=0.2, a pressure of 4 Torr and a high frequency power of 90 W. The flow rate was controlled with a mass flow controller. Substrate temperature was increased up to 600° C. during the reactive formation of the layer. After 2 hours, the SiC layer with a thickness of 2.2 $\mu$m was formed. Thereafter, the substrate was cooled, followed by back etching of the silicon substrate in the central part of its back side to a size of 40 mm$\phi$ to obtain an X-ray mask support having the SiC support membrane. The SiC support membrane thus obtained was amorphous, contained a great deal of carbon, and had a specific resistance of 0.1 $\Omega$.cm. A gold pattern was further formed on the support membrane to prepare an X-ray mask, and the support membrane and wafer with X-ray sensitive member thereon were electrically connected to each other to effect elimination of electric charges. Upon exposure of this X-ray mask, no enlargement of the ground potential of the support membrane was caused, and no deformation in the support membrane was observed.

EXAMPLE 3

Figure 2:
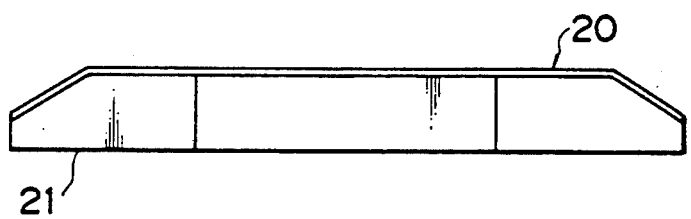
FIG. 2 is a schematic cross section of the X-ray mask support of the present invention.
Figure 3:
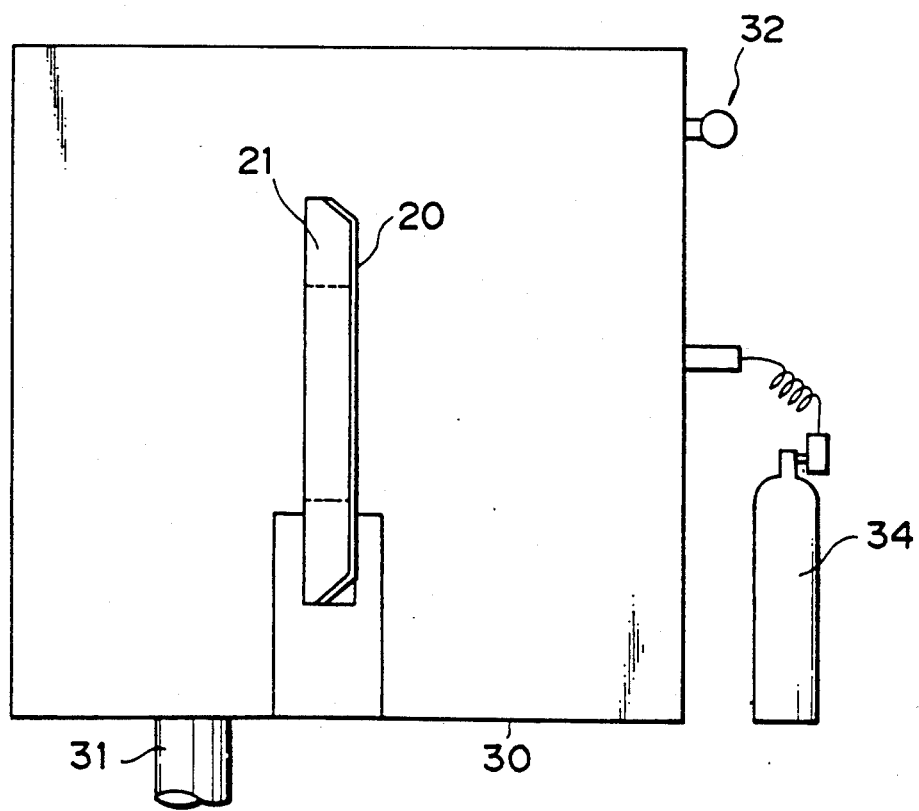
FIG. 3 is a schematic cross section to describe a method of preparing the X-ray mask support of the present invention.

As a third example, polyphenylene sulfide, as used for a heat-resistant structural material was used as the material for the membrane. As illustrated in FIG. 2, a thin layer 20 of polyphenylene sulfide with a thickness of 4 $\mu$m was stretchingly held on a circular frame 21, and adhesion-fixed in that state, followed by hot annealing at 200° C. for 1 hour. Next, the above frame fitted with the support membrane was disposed standing in a vacuum chamber 30 as illustrated in FIG. 3, and its inside was evacuated through exhaust 31 to $10^{31\ 6}$ Torr. Thereafter, arsenic tetraflouride AsF$_5$ from container 34 was fed up to 1 Torr. Pressures were monitored by pressure gage 32. A doping treatment was carried out at room temperature by leaving it overnight in the chamber. After the doping treatment, the inside of the vacuum chamber was restored to a normal pressure and thereafter the product was taken out to obtain a mask blank.

The amount of the dorpant was analyzed and found to be 5 wt. % based on the membrane material polyethylene sulfide. Electrical resistivity was also measured to obtain a specific of a 0.8 $\Omega$. cm. An absorber was formed on the above mask blank to prepare an X-ray mask, and a means of applying a voltage on each of the support membrane and wafer with X-ray sensitive member thereon was provided to effect elimination of electric charges. Upon irradiation of X-rays (wavelength: 10 Å), no local electrostatic charging was caused, and also, no deformation was observed in the support membrane.

What is claimed is:

1. An X-ray exposure process comprising the steps of:
    arranging an X-ray mask adjacent to and spaced from a wafer having an X-ray sensitive membrane thereon, the mask including a support frame and a support membrane held thereon which is X-ray transmissive and has an electrical resistivity of 10 $\Omega$. cm. or less, and an X-ray absorber provided in a pattern form on the surface of the support membrane;
    irradiating the wafer having the X-ray sensitive member thereon with X-rays through the X-ray mask; and
    cancelling the potential difference between the X-ray mask and the wafer.

2. The X-ray exposure process according to claim 1, wherein the support membrane includes at least one of conductive ceramics and a conductive organic compound.

3. The X-ray exposure process according to claim 1, wherein the support membrane includes an organic material having a thickness of from 1 $\mu$m to 15 $\mu$m.

4. The X-ray exposure process according to claim 1, wherein the support membrane includes an inorganic material having a thickness of from 0.5 $\mu$m to 5 $\mu$m.

5. The X-ray exposure process according to claim 1, further comprising setting the X-ray mask with a gap of from 5 μm to 100 μm relative to the wafer having the X-ray sensitive member thereon.

6. The X-ray exposure process according to claim 1, further comprising stretching the support membrane made of an organic material over the support frame.

7. The X-ray exposure process according to claim 1, further comprising arranging the surface of the X-ray mask parallel to the surface of the wafer having the X-ray sensitive member thereon.

8. The X-ray exposure process according to claim 1, wherein said cancelling step comprises electrically connecting the support membrane to the wafer having the X-ray sensitive member thereon.

9. The X-ray exposure process according to claim 1, wherein said cancelling step comprises grounding each of the support membrane and the wafer having the X-ray sensitive member thereon.

10. The X-ray exposure process according to claim 1, wherein said cancelling step comprises applying a voltage to each of the support membrane and the wafer having the X-ray sensitive member thereon to eliminate a potential difference therebetween.

11. An X-ray exposure process according to claim 1, wherein said cancelling step is effected at least during said X-ray irradiation step.

12. An X-ray mask exposure process comprising the steps of:
arranging an X-ray mask adjacent to and spaced from a wafer having an X-ray sensitive member thereon, the mask including a support frame and a support membrane held thereon which is X-ray transmissive and has an electrical resistivity of 10 Ω or less, and an X-ray absorber provided in a pattern form on the surface of the support membrane;
registering the X-ray mask and the wafer with an alignment light;
irradiating the wafer having the X-ray sensitive member thereon with X-rays through the X-ray mask; and
cancelling the potential difference between the X-ray mask and the wafer.

13. The X-ray exposure process according to claim 12, wherein the support membrane includes at least one of conductive ceramics and a conductive organic compound.

14. The X-ray exposure process according to claim 12, wherein the support membrane includes an organic material having a thickness of from 1 μm to 15 μm.

15. The X-ray exposure process according to claim 12, wherein the support membrane includes an inorganic material having a thickness of from 0.5 μm to 5 μm.

16. The X-ray exposure process according to claim 12, further comprising setting the X-ray mask with a gap of from 5 μm to 100 μm relative to the wafer having the X-ray sensitive member thereon.

17. The X-ray exposure process according to claim 12, further comprising stretching the support membrane made of an organic material over the support frame.

18. The X-ray exposure process according to claim 12, further comprising arranging the surface of the X-ray mask parallel to the surface of the wafer having the X-ray sensitive member thereon.

19. The X-ray exposure process according to claim 12, wherein said cancelling step comprises electrically connecting the support membrane to the wafer having the X-ray sensitive member thereon.

20. The X-ray exposure process according to claim 12, wherein said cancelling step comprises grounding each of the support membrane and the wafer having X-ray sensitive member thereon.

21. The x-ray exposure process according to claim 12, wherein said cancelling step comprises applying a voltage to each of the support membrane and the wafer having the X-ray sensitive member thereon to eliminate a potential difference therebetween.

22. The X-ray exposure process according to claim 12, wherein said registering step comprises registering the X-ray mask and the wafer with one of visible and infrared light as alignment light.

23. An X-ray exposure process according to claim 12, wherein said cancelling step is effected at least during said X-ray irradiation step.

* * * * *

UNITED STATES PATENT AND TRADEMARK OFFICE
CERTIFICATE OF CORRECTION

PATENT NO. : 5,048,066                                Page 1 of 3

DATED      : September 10, 1991

INVENTOR(S): YASUAKI FUKUDA

It is certified that error appears in the above-identified patent and that said Letters Patent is hereby corrected as shown below:

On title page, item
[63]

Related U.S. Application Data, "Dec. 27, 1989," should read --Dec. 27, 1988,--.

[56] REFERENCES CITED

U.S. Patent Documents, insert
--3,743,842  7/1973  Smith, et al........250/320
  3,949,131  4/1976  Fraser..............428/201
  4,375,427  3/1983  Miller, et al.......252/512
  4,440,669  4/1984  Ivory, et al........252/518
  4,701,391  10/1987 Lentfer, et al......430/5--.

Foreign Patent Documents, insert
--2168053  8/1973  France..................
  2275882  1/1976  France..................
  0097764  1/1984  EPA.....................
  0104685  7/1985  EPA.....................--.

Other References, insert
--Cook, et al., "Low Reflective, High Conductive, Metal Mask Photo Plane," IBM Technical Disclosure Bulletin, August 1983, Vol. 26, No. 3A.
Japanese Patent Abstracts, 6/1981, Vol. 5, Number 100, No. 56-43641.

Japanese Patent Abstracts, 10/1981, Vol. 5, Number 157, No. 56-88137.
Japanese Patent Abstracts, 4/1984, Vol. 8, Number 81, No. 59-2324.--

UNITED STATES PATENT AND TRADEMARK OFFICE
CERTIFICATE OF CORRECTION

PATENT NO. : 5,048,066

DATED : September 10, 1991

INVENTOR(S) : Yasuaki Fukuda

It is certified that error appears in the above-identified patent and that said Letters Patent is hereby corrected as shown below:

COLUMN 1

Line 13, "particularly" should read --particularly,--.
    Line 54, "only:" should read --only--.

COLUMN 3

Line 5, "said" should be deleted.
    Line 65, "dopant pro-" should read --dopant, pro---.

COLUMN 4

Line 1, "( or" should read --(or--.

UNITED STATES PATENT AND TRADEMARK OFFICE
CERTIFICATE OF CORRECTION

PATENT NO. : 5,048,066

DATED : September 10, 1991

INVENTOR(S) : YASUAKI FUKUDA

It is certified that error appears in the above-identified patent and that said Letters Patent is hereby corrected as shown below:

<u>COLUMN 6</u>

Line 23, "$10^{31}$ $^{6}$Torr." should read --$10^{-6}$ Torr.--.
Line 29, "ter the" should read --ter, the--.
Line 30, "dorpant" should read --dopant--.
Line 33, "of a" should read --resistance of--.

<u>COLUMN 8</u>

Line 30, "X-ray" should read --the X-ray--.
Line 31, "x-ray" should read --X-ray--.

Signed and Sealed this

Thirtieth Day of March, 1993

*Attest:*

STEPHEN G. KUNIN

*Attesting Officer*  *Acting Commissioner of Patents and Trademarks*